(12) United States Patent
Kudo

(10) Patent No.: US 6,370,663 B1
(45) Date of Patent: Apr. 9, 2002

(54) SEMICONDUCTOR INTEGRATED CIRCUIT

(75) Inventor: Kazuya Kudo, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/225,434

(22) Filed: Jan. 5, 1999

(30) Foreign Application Priority Data

Jan. 5, 1998 (JP) .......................................... 10-000414

(51) Int. Cl.[7] .............................................. G01R 31/28
(52) U.S. Cl. ........................ 714/724; 714/726; 714/733
(58) Field of Search .............................. 714/724, 726, 714/731, 733, 736

(56) References Cited

U.S. PATENT DOCUMENTS

| 4,703,257 | A | | 10/1987 | Nishida et al. ............. 324/73.1 |
| 5,392,296 | A | * | 2/1995 | Suzuki ........................ 714/731 |
| 5,406,567 | A | * | 4/1995 | Ogawa ........................ 714/724 |
| 5,729,553 | A | * | 3/1998 | Motohara ................... 714/733 |

FOREIGN PATENT DOCUMENTS

| EP | 0 699 920 A2 | 8/1995 |
| JP | 50-17739 | 2/1975 |
| JP | 52-55874 | 5/1977 |
| JP | 61-272668 | 12/1986 |
| JP | 62-261168 | 11/1987 |
| JP | 01-192161 | 8/1989 |
| JP | 04-370775 | 12/1992 |
| JP | 05-312920 | 11/1993 |
| JP | 05-341014 | 12/1993 |
| JP | 06-289106 | 10/1994 |
| JP | 07-167923 | 7/1995 |
| JP | 8-170978 | 7/1996 |
| JP | 11-2665 | 1/1999 |

* cited by examiner

*Primary Examiner*—Emmanuel L. Moise
(74) *Attorney, Agent, or Firm*—Hutchins, Wheeler & Dittmar

(57) ABSTRACT

A semiconductor integrated circuit comprises a first circuit block constituting an input circuit, a second circuit block constituted of a predetermined function block, a third circuit block constituting an output circuit. The first, second and third circuit blocks are cascade-connected in a normal operation. A testing additional circuit for performing a function test for the second circuit block, is provided only at an input side of the second circuit block, and the second circuit block is connected directly to the third circuit block through only interconnections with neither a logic gate nor a multiplexer.

8 Claims, 4 Drawing Sheets

SEMICONDUCTOR INTEGRATED CIRCUIT

BACKGROUND THE INVENTION

1. Field of the Invention

The present invention relates to a semiconductor integrated circuit, and more specifically to a semiconductor integrated circuit having an improved efficiency in a function test for a plurality of circuit blocks each realizing a predetermined function.

2. Description of Related Art

With a recent scale-up of a semiconductor integrated circuit, a plurality of circuit blocks for realizing various functions have been incorporated in a single semiconductor integrated circuit. These circuit blocks are interconnected to function as one semiconductor integrated circuit. On the other hand, the semiconductor integrated circuit has a plurality of input terminals and a plurality of output terminals for interface with an external of the semiconductor integrated circuit.

In addition, each of circuit blocks has a plurality of input nodes and a plurality of output nodes so that the circuit blocks are interconnected in the inside of the semiconductor integrated circuit. However, the circuit blocks cannot be controlled and observed directly at the input terminals and the output terminals of the semiconductor integrated circuit.

Nevertheless, it is necessary to verify whether or not all functions of the circuit blocks operate normally. For this purpose, it is necessary to supply a predetermined signal from the input terminals of the semiconductor integrated circuit to the respective circuit blocks and to observe the result of the operation of each circuit block at the output terminals of the semiconductor integrated circuit.

In the prior art, as a means for verifying the function of the circuit blocks, there is a means for directly connecting the input terminals and the output terminals of the semiconductor integrated circuit to the input nodes and the output nodes of any selected circuit block. However, this means requires a plurality of multiplexers and a number of interconnections, with the result that the circuit scale of the semiconductor integrated circuit inevitably becomes large.

In addition, a scan-path test is known, in which, in a test mode, all flipflops included in the semiconductor integrated circuit are cascade-connected by switching over multiplexers, so as to constitute one long shift register, and after a predetermined signal is given from the input terminal of the semiconductor integrated circuit to the shift register composed of the cascade-connected flipflops, an internal condition of the semiconductor integrated circuit is transferred into the shift register, and then, the content of the shift register is outputted to an external of the semiconductor integrated circuit. However, this means also requires a number of multiplexers for the purpose of connecting all the flipflops in the form of the shift register, and therefore, the circuit scale also inevitably becomes large.

One proposal for overcoming the above mentioned problems of the prior art is disclosed in Japanese Patent Application Pre-examination Publication No. JP-A-08-170978 and its corresponding U.S. Pat. No. 5,729,553, the content of which is incorporated by reference in its entirety into this application. The above mentioned scan-path test is described even in JP-A-08-170978 and U.S. Pat. No. 5,729,553. In the scan-path test described even in JP-A-08-170978 and U.S. Pat. No. 5,729,553, an input signal serially supplied bit by bit from an external circuit is applied to the shift register, and the signals held in the shift register are supplied to a combinational circuit. Each of the flipflops constituting the shift register fetches the test result of the combinational circuit in a normal mode, and the test result fetched in the shift register is serially outputted bit by bit from the shift register to the external terminal in the scan mode. As a result, the test result can be observed.

Referring to FIG. 4 which shows a circuit diagram of the semiconductor integrated circuit disclosed in JP-A-08-170978 and U.S. Pat. No. 5,729,553, explanation will be made, by dividing the situation into a condition in which a function inherent to a semiconductor integrated circuit 1$d$ is realized while exchanging various signals between an internal circuit of the semiconductor integrated circuit and an external circuit (this will be called a "normal mode" hereinafter), and another condition in which a function test of respective circuit blocks 81, 82 and 83 is conducted (this will be called a "test mode" hereinafter).

An input terminal 3 receives an input signal DIN supplied in a parallel format of for example 64 bits, from an external circuit when the semiconductor integrated circuit 1$d$ is in the normal mode. This input signal will be called a "normal input signal" hereinafter. An output terminal 7 outputs an output signal DOUT in the parallel format of for example 64 bits, to the external circuit when the semiconductor integrated circuit 1$d$ is in the normal mode. This output signal will be called a "normal output signal" hereinafter.

An input terminal 2 receives a testing input signal TIN supplied in a parallel format of for example 32 bits, from an external circuit in the test mode for the circuit block 82. In the case that the testing signal is of 64 bits, the testing input signal is given by supplying first 32 bits at a first time, and then, remaining 32 bits at a second time.

An output terminal 8 outputs a test output signal TOUT in the parallel format of for example 32 bits, to the external circuit in the test mode for the circuit block 82. This test output signal will be called a "test output" hereinafter.

An input terminal 6 receives a clock signal CLK from a circuit external to the semiconductor integrated circuit 1$d$. Input terminals 4 and 5 respectively receive mode control signals SEL1 and SEL2 for switching between the normal mode of the semiconductor integrated circuit 1$d$ and the test mode of the circuit block 82. The two mode control signals SEL1 and SEL2 are required in order to perform a control of multiplexers 21 and 22 and a control of multiplexers 25 and 26, independently of each other, in the test mode of the circuit block 82.

First, the normal mode of the semiconductor integrated circuit 1$d$ will be described. The mode control signal SEL1 is set to select output signals S71 and S72 of the circuit block 81, and the mode control signal SEL2 is set to select output signals S76 and S77 of the circuit block 82. The normal input signal DIN of 64 bits given to the input terminal 3 from the external circuit is supplied to the circuit block 81. A first 32-bit portion input of the 64-bit normal input signal thus supplied is selected as the output signal S71 of the circuit block 81 by the multiplexer 21, and then, supplied as a selected output signal S73 to a flipflop 23 so that it is stored in the flipflop 23 in synchronism with the clock CLK. The first 32-bit portion input stored in the flipflop 23 is supplied as an output signal S75 to the circuit block 82 in synchronism with the clock CLK.

The remaining second 32-bit portion input of the 64-bit normal input signal is selected as the output signal S72 of the circuit block 81 by the multiplexer 22, and then, supplied as a selected output signal S74 to a flipflop 24 so that it is stored in the flipflop 24 in synchronism with the clock CLK. The second 32-bit portion input signal S74 stored in the flipflop 24 is supplied to the circuit block 82 in synchronism with the clock CLK. An output signal S77 of the circuit block 82 corresponding to the second 32-bit portion input signal S74 is supplied through the multiplexer 26 to the circuit block 83.

On the other hand, an output signal S76 of the circuit block 82 corresponding to the first 32-bit portion input is supplied through the multiplexer 25 to the circuit block 83. The result of the operation of the circuit block 83 is outputted to the output terminal 7 as the 64-bit output signal DOUT.

Next, the test mode of the circuit block 82 will be described. In the test mode, first, the mode control signals are set to supply the testing input signal TIN to the circuit block 82. Namely, the mode control signal SEL11 is set to select an output signal S78 of the multiplexer 25 and an output signal S79 of the multiplexer 26, and the mode control signal SEL2 is set to select the testing input signal TIN and the output signal S75 of the flipflop 23.

In a first clock cycle of the clock signal CLK, the first 32-bit portion input of the testing input signal TIN given through the input terminal 2 is selected by the multiplexer 25, and the output signal S78 of the multiplexer 25 is selected by the multiplexer 21 so that it is stored in the flipflop 23.

In a second clock cycle of the clock signal CLK, the portion testing input signal TIN stored in the flipflop 23 in the first clock cycle is selected by the multiplexer 26, and the output signal S79 of the multiplexer 26 is selected by the multiplexer 22 to be supplied to the flipflop 24.

The second 32-bit portion input of testing input signal TIN given through the input terminal 2 in the same second clock cycle is selected by the multiplexer 25, and the output signal S78 of the multiplexer 25 is selected by the multiplexer 21 so that it is stored in the flipflop 23 and then supplied to the circuit block 82.

Namely, the input signal TIN is divided into the first 32-bit portion input and the second 32-bit portion input, which are supplied to the input terminal 2 in the named order, so that these portions are inputted into the circuit block 82 through different paths, respectively.

After the testing input has been supplied to the circuit block 82, the setting of the mode control signals is changed in order to observe the test result. Namely, the mode control signal SEL1 is set to select the output signal S78 of the multiplexer 25 and the output signal S79 of the multiplexer 26, and the mode control signal SEL2 is set to select the output signals S76 and S77 of the circuit block 82.

The output signal S76 indicative of the test result of the circuit block 82 corresponding to the second 32-bit portion input is supplied through the multiplexer 25 and the multiplexer 21 and stored in the flipflop 23 during the period of one clock cycle. The output signal S77 indicative of the test result of the circuit block 82 corresponding to the first 32-bit portion input is supplied through the multiplexer 26 and the multiplexer 22 and stored in the flipflop 24 during the period of the same one clock cycle.

Thereafter, the mode control signal SEL1 is set to select an output signal S78 of the multiplexer 25 and an output signal S79 of the multiplexer 26, and the mode control signal SEL2 is set to select the testing input signal TIN and the output signal S75 of the flipflop 23, again, so that the result of the test of the circuit block 82 stored in the flipflops 23 and 24 is shifted in the flipflops 23 and 24 cascade-connected in the form of a shift register.

Namely, in a first clock cycle, the test result of the circuit block 82 stored in the flipflop 24 corresponding to the first 32-bit portion input is observed at the test output terminal 8, and in a second clock cycle, the test result of the circuit block 82 stored in the flipflop 23 corresponding to the second 32-bit portion input is selected as the output signal of the flipflop 23 by the multiplexer 26 and then selected by the multiplexer 22 to be stored in the flipflop 24, and the output of the flipflop is observed as the test result TOUT at the test output terminal 8.

Namely, five clock cycles are required in order to supply the testing input signal TIN through the test input terminal 2, to cause an internal circuit of the circuit block to operate, and to observe the test result TOUT at the test output terminal 8.

Various problems have been encountered in the above mentioned prior art semiconductor integrated circuit 1d.

A first problem is that, in the normal mode, since the flipflops exist in the input path from the circuit block 81 to the circuit block 82, the inputting of the signal from the circuit block 81 to the circuit block 82 can be performed only at a timing in synchronism with the clock, and therefore, the operation speed of the normal mode is low.

A second problem is that, in the normal mode, since the multiplexers exist in the output path from the circuit block 82 to the circuit block 83, a delay occurs in the outputting from the circuit block 82 to the circuit block 83, and therefore, the operation speed is low.

A third problem is that, in the test mode of the circuit block 82, since a plurality of multiplexers exists between the flipflops cascade—connected to constitute the shift register, a delay occurs in the path constituting the shift register, and therefore, the operation speed is low.

SUMMARY OF THE INVENTION

Accordingly, it is an object of the present invention to provide a semiconductor integrated circuit which has overcome the above mentioned problems of the prior art.

Another object of the present invention is to provide a semiconductor integrated circuit capable of efficiently performing all function tests of a plurality of circuit blocks each realizing a predetermined function, and capable of minimizing the lowering of the circuit operation speed both in the normal mode and in the test mode.

The above and other objects of the present invention are achieved in accordance with the present invention by a semiconductor integrated circuit comprising a first circuit block constituting an input circuit, a second circuit block constituted of a predetermined function block, a third circuit block constituting an output circuit, the first, second and third circuit blocks being cascade-connected, and a testing additional means for performing a function test for the second circuit block, the testing additional means being provided only at an input side of the second circuit block, and the second circuit block being connected directly to the third circuit block through only interconnections.

In a normal operation mode, only one signal selection means for selecting an input signal is provided in a signal transfer path between a first output node of the first circuit block and a first input node of the second circuit block, and only one signal selection means for selecting an input signal is provided in a signal transfer path between a second output node of the first circuit block and a second input node of the second circuit block. In a testing mode using the testing additional circuit, a plurality of flipflops of the number corresponding to the number of the input nodes of the second circuit block, provided for storing a testing signal when a testing signal is applied to the second circuit block and also for storing a test result signal when the test result signal is outputted from the second circuit block, are cascade-connected to constitute a shift register, so that the test result signal is serially outputted by a shifting action of the shift register, with only one signal selection means being interposed between each pair of adjacent flipflops of the shift register.

In one embodiment of the semiconductor integrated circuit, the testing additional means includes a test input terminal for serially receiving the testing signal from an external circuit for the function test of the second circuit block, a test output terminal for serially outputting the test result signal so that the result of the function test of the second circuit block is observed externally, a clock terminal for receiving a clock signal from the external circuit, a first mode control terminal for receiving a first mode control signal from the external circuit, a second mode control terminal for receiving a second mode control signal from the external circuit, the first and second mode control signals being used for changing an operation condition in the test mode, a first multiplexer controlled by the first mode control signal for selectively outputting either a signal from the first output node of the second circuit block or a signal from the test input terminal, a first flipflop for holding the signal selected by the first multiplexer in synchronism with the clock signal, a second multiplexer controlled by the second mode control signal for selectively outputting either a signal from one of outputs of the first flipflop or a signal from the first output node of the first circuit block, a third multiplexer controlled by the first mode control signal for selectively outputting either a signal from the other output of the first flipflop or a signal from the second output node of the second circuit block, a second flipflop for holding the signal selected by the second multiplexer in synchronism with the clock signal, for outputting the selected signal to the test output terminal, and a fourth multiplexer controlled by the second mode control signal for selectively outputting either a signal from one of outputs of the second flipflop or a signal from the second output node of the first circuit block.

Furthermore, when the function test of the second circuit block is conducted, the testing additional means cascade-connects the first multiplexer, the first flipflop, the second multiplexer and the second flipflop in the named order to cause them to constitute one shift register, so that a first testing signal inputted from the test input terminal at a first clock and a second testing signal inputted from the test input terminal at a second clock are serially inputted to the shift register and held in the shift register, and the second testing signal held in the first flipflop at the second clock is supplied through the second multiplexer to the first input node of the second circuit block, and the first testing signal held in the second flipflop at the second clock is supplied through the fourth multiplexer to the second input node of the second circuit block, and wherein, of the test result of the function test of the second circuit block, a first partial output is held in the first flipflop through the first multiplexer at a third clock, and simultaneously, a second partial output is held in the second flipflop through the third multiplexer, and thereafter, the first flipflop and the second flipflop are cascade-connected to constitute the shift register, again, under control of the first mode control signal, the test result of the function test is serially outputted from the test output terminal at fourth and fifth clocks.

In one modification of the semiconductor integrated circuit, the number of the input nodes of the second circuit block is larger than the number of the output nodes of the second circuit block by at least one, and the first circuit block includes a third output node, and the second circuit block includes a third input node. The testing additional means further includes a fifth multiplexer controlled by the first mode control signal for selectively outputting either a signal from the other output of the second flipflop or the signal from the second output node of the second circuit block, a third flipflop for holding the signal selected by the fifth multiplexer in synchronism with the clock signal, for outputting the selected signal to the test output terminal, and a sixth multiplexer controlled by the second mode control signal for selectively outputting either a signal from one of outputs of the third flipflop or a signal from the third output node of the first circuit block, the third multiplexer receiving the signal from the first output node of the second circuit block in place of the signal from the second output node of the second circuit block, so that the number of the input nodes of the second circuit block is adapted to the number of the output nodes of the second circuit block.

In another modification of the semiconductor integrated circuit, the number of the output nodes of the second circuit block is larger than the number of the input nodes of the second circuit block by at least one, and the second circuit block includes a third output node. The testing additional means further includes an exclusive-OR circuit of the number smaller than the number of the input nodes of the second circuit block by at least one, and the third multiplexer other than the first multiplexer, of the multiplexers located at an input side of the first and second flipflops, receives, in place of the signal from the second output node of the second circuit block, an output signal of the exclusive-OR circuit receiving signals which are outputted from the second and third output nodes of the second circuit block, so that the number off the output nodes of the second circuit block is adapted to the number of the input nodes of the second circuit block.

Furthermore, each of the input signal given to the first circuit block and the testing signal given to the testing additional means is a signal of an arbitrary bit number, and each of the output nodes of the first circuit block and the input nodes of the second circuit block is a signal of the same arbitrary bit number obtained by dividing the arbitrary bit number, and each of the output nodes of the second circuit block is a signal of the bit number including the same arbitrary bit number and obtained by dividing the arbitrary bit number.

The above and other objects, features and advantages of the present invention will be apparent from the following description of preferred embodiments of the invention with reference to the accompanying drawings.

DESCRIPTION OF PREFERRED EMBODIMENTS

Now, three embodiments of the semiconductor integrated circuit in accordance with the present invention will be described with reference to the accompanying drawings.

Figure 1:
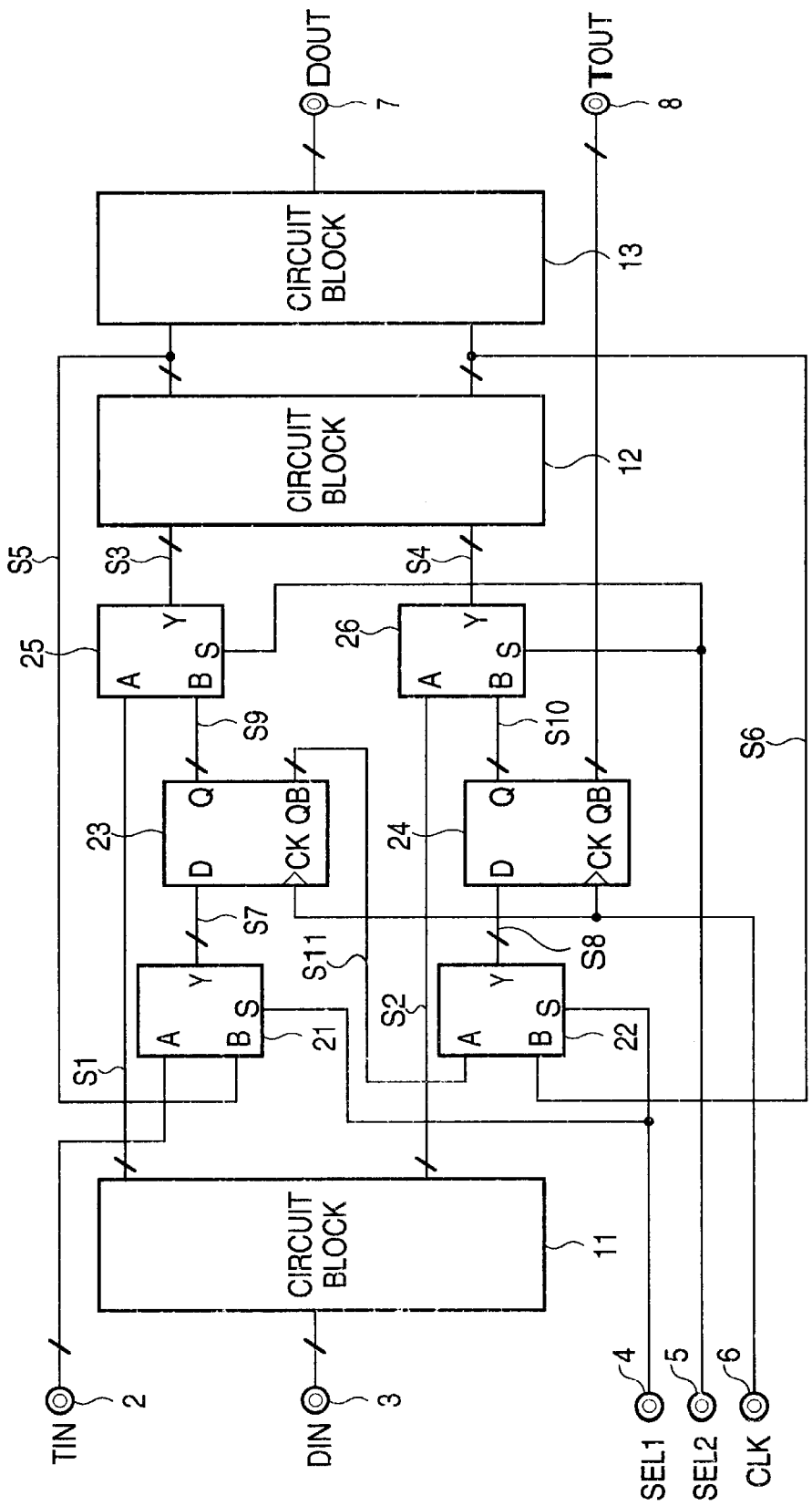
FIG. 1 is a block diagram of a first embodiment of the semiconductor integrated circuit in accordance with the present invention.

FIG. 1 is a block diagram of a first embodiment of the semiconductor integrated circuit in accordance with the present invention. As shown in FIG. 1, the semiconductor integrated circuit is generally designated with Reference Numeral 1a, and comprising external input terminals 2, 3, 4, 5 and 6, external output terminals 7 and 8, a first circuit block 11, a second circuit block 12, a third circuit block 13, and a testing additional circuit, which are connected as shown. The first circuit block 11 mainly constitutes an input circuit and has an input node connected to the external input terminal 3, a first output node for outputting an output signal S1, and a second output node for outputting an output signal S2.

The second circuit block 12 is constituted of a predetermined function block, for example, a CPU, a ROM, or a RAM, or alternatively, a random logic circuit. This second circuit block 12 includes a first input node, a second input node, a first output node for outputting an output signal S5, and a second output node for outputting an output signal S6. The third circuit block 13 mainly constitutes an output curcuit and has a first input node receiving the output signal S5, a second input node receiving the output signal S6, and an output node for outputting an output signal DOUT to the external output terminal 7.

The testing additional circuit is located between the circuit block 11 and the circuit block 12 in order to test the circuit block 12. The testing additional circuit includes a multiplexer 21 having a pair of input nodes A and B and an output node Y, a flipflop 23 receiving at a data input node D a signal S7 from the output node Y of the multiplexer 21 to hold it in synchronism with a clock signal, and another multiplexer 25 having an input node B receiving a Q (non-inverting) output signal S9 of the flipflop 23, another input node A receiving the first output signal S1 of the circuit block 11 and an output node Y for supplying a selected signal S3 to the first input node of the circuit block 12.

The testing additional circuit also includes a multiplex 22 having a pair of input nodes A and B and an output node Y, a flipflop 24 receiving at a data input node D a signal S8 from the output node Y of the multiplexer 22 to hold it in synchronism with a clock signal, and a multiplexer 26 having an input node B receiving a Q (non-inverting) output signal S10 of the flipflop 24, another input node A receiving the second output signal S2 of the circuit block 11 and an output node Y for supplying a selected signal S4 to the second input node of the circuit block 12.

In the above mentioned construction, the external input terminal 3 and the external output terminal 7 are adapted for a parallel signal format of for example 64 bits, and the external input terminal 2, the external output terminal 8, and the signals S1, S2, S3, S4, S5, S6, S7, S8, S9 and S10 are adapted for a parallel signal format of for example 32 bits which are obtained by halving the 64 bits. In the drawing, only one bit of these terminals and these signals is shown for simplification of the drawing and for making it easier to understand.

In addition, only one set of the circuit block 12 and the associated testing additional circuit are shown for simplification of description. However, it would be a matter of course to persons skilled in the art that a plurality of sets can be provided.

The input terminal 3 receives a normal input signal DIN supplied from an external circuit when the semiconductor integrated circuit 1a is in a normal mode. This input signal is assumed to be given in a parallel format of for example 64 bits, similarly to the prior art example mentioned hereinbefore. The input terminal 2 receives a testing input signal TIN supplied from an external circuit in the test mode for the circuit block 12. The input terminals 4 and 5 respectively receive mode control signals SEL1 and SEL2 for switching between the normal mode of the semiconductor integrated circuit 1a and the test mode of the circuit block 12. The input terminal 6 receives a clock signal CLK from a circuit external to the semiconductor integrated circuit 1a.

The output terminal 7 outputs the normal output signal DOUT to the external circuit in the normal mode. The output terminal 8 outputs a test output so that the test result is observed at an external in the test mode for the circuit block 82.

The two mode control signals SEL1 and SEL2 are required in order to perform a control of the multiplexers 21 and 22 and a control of the multiplexers 25 and 26, independently of each other, in the test mode of the circuit block 12.

As mentioned above, although only one bit is shown in the drawing, since the input terminal 3 is adapted to the 64-bit parallel signal format, parallel 64 bits are supplied to the circuit block 11. The output signal of this circuit block 11 is divided into a first 32-bit partial signal and a second 32-bit partial signal, and the first 32-bit partial signal is supplied as the output signal S1 to the input node A of the multiplexor 25.

First, an operation in the normal mode will be described. In the normal mode, the mode control signal SEL2 is set to select the output signals S1 and S2 of the circuit block 11. On the other hand, the mode control signal SEL1 can be set at an arbitrary value.

The normal input signal DIN supplied through the input terminal 3 is applied to the circuit block 11. The output signal S1 of the circuit block 11 is supplied through only the multiplexer 25 to the circuit block 12. The output signal S2 of the circuit block 11 is supplied through only the multiplexer 26 to the circuit block 12. The output signal S5 of the circuit block 12 is supplied directly to the first input node of the circuit block 13 through no logic gate. The output signal S6 of the circuit block 12 is supplied directly to the second input node of the circuit block 13 through no logic gate. The normal output signal DOUT of the circuit block 13 is outputted to the output terminal 7.

Next, an operation in the test mode of the circuit block 12 will be described. In the test mode, first, the mode control signals are set to supply the testing input signal TIN to the circuit block 12. Specifically, the mode control signal SEL1 is set to select the testing input signal TIN and an output signal S11 outputted from an inverting output QB of the flipflop 23, and the mode control signal SEL2 is set to select the signals S9 and S10.

In a first clock cycle, the first test input (of 32 bits) supplied as the testing input signal TIN is selected by the multiplexer 21 and stored in the flipflop 23 in synchronism with the clock CLK. In a second clock cycle, the test input stored in the flipflop 23 is selected as the output signal S11 of the flipflop 23 by the multiplexer 22, and stored in the flipflop 24 in synchronism with the clock CLK. Furthermore, the test input stored in the flipflop 24 is selected by the multiplexer 26 and supplied as the output signal S4 of the flipflop 24 to the second input node of the circuit block 12.

In the same second clock cycle, the second test input (of 32 bits) supplied as the testing input signal TIN is selected by the multiplexer 21 and stored in the flipflop 23 in synchronism with the clock CLK. Furthermore, the test input stored in the flipflop 23 is selected as the output signal S9 of the flipflop 23 by the multiplexer 25, and the signal selected by the multiplexer 25 is supplied as the output signal S3 to the first input node of the circuit block 12.

After the testing of the circuit block 12 is completed, the mode control signals are set again in order to observe the test result. For this purpose, the mode control signal SEL1 is set to select the output signals S5 and S6 which are outputted from the first output node and the second output node of the circuit block 12, respectively. The mode control signal SEL2 is set to select the output signal S9 of the flipflop 23 and the output signal S10 of the flipflop 24.

The output signal S5 indicative of the test result, outputted from the first output node of the circuit block 12, is selected by the multiplexer 21 during one clock cycle, and stored in the flipflop 23 in synchronism with the clock signal CLK. The output signal S6 indicative of the test result, outputted from the second output node of the circuit block 12, is selected by the multiplexer 22 during the same one clock cycle, and stored in the flipflop 24 in synchronism with the clock signal CLK.

Thereafter, the mode control signal SEL1 is set to select the testing input signal TIN and an output signal S11 outputted from the inverting output QB of the flipflop 23, so that the test result of the circuit block 12 stored in the flipflops 23 and 24 is shifted by a shifting operation of the flipflops 23 and 24 cascade-connected to constitute the shift register because the multiplexer 22 selects the output signal S11 of the flipflop 23.

In a first clock cycle, the test result TOUT stored in the flipflop 24 is observed from an inverting output QB of the flipflop 24 at the output terminal 8, and in a second clock cycle, the test result TOUT stored in the flipflop 23 is shifted to the flipflop 24, so that the inverting output QB of the flipflop 24 can be observed at the output terminal 8.

Namely, the operation for supplying the testing input signal TIN through the test input terminal 2, for causing an internal circuit of the circuit block 12 to operate, and for observing the test result TOUT at the test output terminal 8, is completed with five clock cycles.

In the normal operation of the above mentioned first embodiment, since either the circuit such as the flipflop operating in synchronism with the clock, or a random logic circuit, does not exist in the signal transfer path between the circuit blocks 11 and 12, and since there exist only the multiplexer 25 for the signal selection between the first output node of the circuit block 11 and the first input node of the circuit block 12, and the multiplexer 26 for the signal selection between the second output node of the circuit block 11 and the second input node of the circuit block 12, the signal delay is minimized.

In the test mode of the above mentioned first embodiment, when the shift register is constituted by cascade-connecting the flipflops 23 and 24, since only the multiplexer 22 exists between the flipflops 23 and 24, the signal delay can be reduced in comparison with the prior art example.

Figure 2:
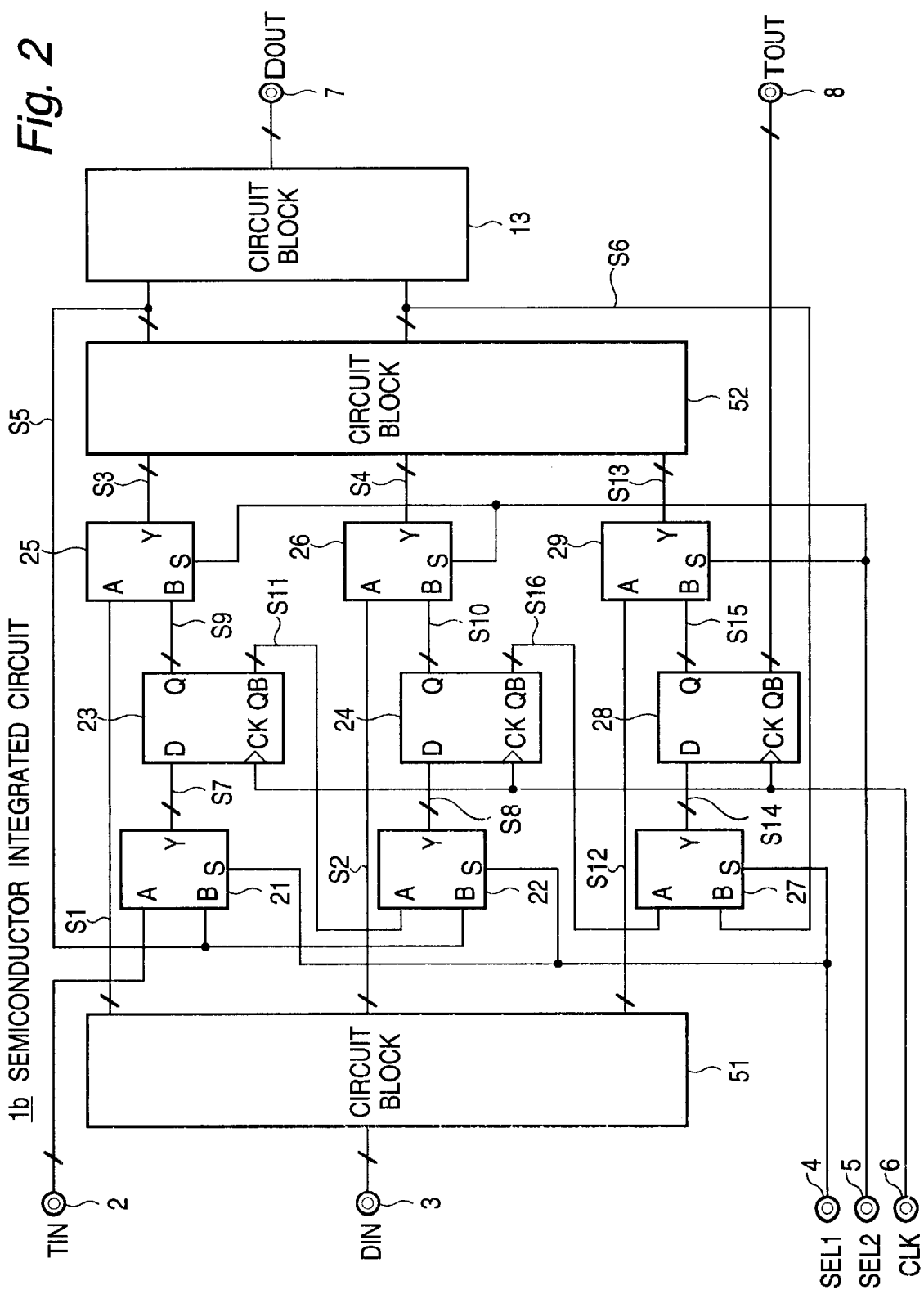
FIG. 2 is a block diagram of a second embodiment of the semiconductor integrated circuit in accordance with the present invention.

Now, a second embodiment of the semiconductor integrated circuit in accordance with the present invention will be described with reference to FIG. 2. In FIG. 2, elements similar to those shown in FIG. 1 are given the same Reference Numerals.

The second embodiment of the semiconductor integrated circuit in accordance with the present invention is generally designated with Reference Numeral 1b, and is different from the first embodiment in that a first circuit block 51 comparable to the circuit block 11, has output nodes of the number which is larger than that of the circuit block 11 by at least one, and the additional output node of the first circuit block 51 is called a third output node, and a second circuit block 52 comparable to the circuit block 12, has input nodes of the number which is larger than that of the circuit block 12 by at least one, and the additional output node of the second circuit block 52 is called a third input node, so that the testing additional circuit is scaled up by increasing the number of output nodes of the first circuit block and the number of the input nodes of the second circuit block.

Specifically, the testing additional circuit of the semiconductor integrated circuit 1b includes a multiplexer 21 having an input node A connected to the input terminal 2 so as to receive the testing input signal TIN, another input node B receiving a first output signal S5 of the circuit block 52, and an output node Y for outputting a selected signal, a flipflop 23 receiving at a data input node D a signal S7 from the output node Y of the multiplexer 21 to hold it in synchronism with a clock signal CLK, and another multiplexer 25 having an input node B receiving a Q (non-inverting) output signal S9 of the flipflop 23, another input node A receiving the first output signal S1 of the circuit block 11 and an output node Y for supplying a selected signal S3 to the first input node of the circuit block 52.

The testing additional circuit also includes, a multiplexer 22 having an input node A for receiving an output signal S11 from an inverting output QB of the flipflop 23, another input node B receiving a first output signal S5 of the circuit block 52, and an output node Y for supplying a selected signal, a flipflop 24 receiving at a data input node D a signal S8 from the output node Y of the multiplexer 22 to hold it in synchronism with the clock signal CLK, and a multiplexer 26 having an input node B receiving a Q (non-inverting) output signal S10 of the flipflop 24, another input node A receiving the second output signal S2 of the circuit block 51 and an output node Y for supplying a selected signal S4 to the second input node of the circuit block 52.

The testing additional circuit furthermore includes a multiplexer 27 having an input node A for receiving an output signal S16 from an inverting output QB of the flipflop 24, another input node B receiving a second output signal S6 of the circuit block 52, and an output node Y for supplying a selected signal, a flipflop 28 receiving at a data input node D a signal S14 from the output node Y of the multiplexer 27 to hold it in synchronism with the clock signal CLK, and a multiplexer 29 having an input node B receiving a Q (non-inverting) output signal S15 of the flipflop 28, another input node A receiving the third output signal S12 of the circuit block 51 and an output node Y for supplying a selected signal S13 to the third input node of the circuit block 52.

Now, an operation of the semiconductor integrated circuit 1b in the normal mode will be described. In the normal mode, the mode control signal SEL2 is set to select the output signals S1, S2 and S12 of the circuit block 51. On the other hand, the mode control signal SEL1 can be set at an arbitrary value.

The normal input signal DIN supplied through the input terminal 3 is applied to the circuit block 51. The output signal S1 outputted from the first output node of the circuit block 51 is selected by only the multiplexer 25 and supplied as the output signal S3 to the first input node of the circuit block 52. The output signal S2 outputted from the second output node of the circuit block 51 is selected by only the multiplexer 26 and supplied as the output signal S4 to the second input node of the circuit block 52. The output signal S12 outputted from the third output node of the circuit block 51 is selected by only the multiplexer 29 and supplied as the output signal S13 to the third input node of the circuit block 52.

The output signal S5 of the circuit block 52 is supplied directly to the first input node of the circuit block 13 through no logic gate. The output signal S6 of the circuit block 52 is supplied directly to the second input node of the circuit block 13 through no logic gate. The normal output signal DOUT of the circuit block 13 is outputted to the output terminal 7.

Next, an operation of the semiconductor integrated circuit 1b in the test mode will be described. In the test mode, first, the mode control signals are set to supply the testing input signal TIN to the circuit block 52. Specifically, the mode control signal SEL1 is set to select the testing input signal TIN, the output signal S11 of the flipflop 23, and the output signal S16 of the flipflop 24, and the mode control signal SEL2 is set to select the signal S9 of the flipflop 23, the signal S10 of the flipflop 24, and the signal S15 of the flipflop 28.

In a first clock cycle, the first testing input signal TIN supplied through the input terminal 2 is selected by the multiplexer 21 and the output signal S7 of the multiplexer 21 is stored in the flipflop 23. In a second clock cycle, the testing input signal stored in the flipflop 23 is selected as the output signal S11 by the multiplexer 22, and the output signal S8 of the multiplexer 22 is stored in the flipflop 24. In the same second clock cycle, the second testing input signal TIN supplied through the input terminal 2 is selected by the multiplexer 21 and the output signal S7 of the multiplexer 21 is stored in the flipflop 23.

In a third clock cycle, the testing input signal stored in the flipflop 24 is selected as the output signal S16 by the multiplexer 27, and the output signal S14 of the multiplexer 27 is stored in the flipflop 28. Furthermore, the testing input signal stored in the flipflop 23 is selected as the output signal S11 by the multiplexer 22, and the output signal S8 of the multiplexer 22 is stored in the flipflop 24. In the same third clock cycle, the third testing input signal TIN supplied through the input terminal 2 is selected by the multiplexer 21 and the output signal S7 of the multiplexer 21 is stored in the flipflop 23.

The three testing input signals stored in the three flipflops 23, 24 and 28, respectively, are selected by the multiplexers 25, 26 and 29, respectively, so as to be supplied as the output signals S3, S4 and S13 to the first, second and third input nodes of the circuit block 53, respectively.

After the testing of the circuit block 52 is completed, the mode control signals are set again in order to observe the test result. For this purpose, the mode control signal SEL1 is set to select the output signals S5 and S6 which are outputted from the first output node and the second output node of the circuit block 52, respectively. The mode control signal SEL2 is set to select the output signal S9 of the flipflop 23, the output signal S10 of the flipflop 24 and the output signal S15 of the flipflop 28.

The output signal S5 indicative of the test result, outputted from the first output node of the circuit block 52, is selected by the multiplexer 21 during one clock cycle, and the output signal S7 of the multiplexer 21 is stored in the flipflop 23 in synchronism with the clock signal CLK. Simultaneously, the output signal S5 is selected by the multiplexer 22, and the output signal S8 of the multiplexer 22 is stored in the flipflop 24.

The output signal S6 indicative of the test result, outputted from the second output node of the circuit block 52, is selected by the multiplexer 27 during the same one clock cycle, and the output signal S14 of the multiplexer 27 is stored in the flipflop 28.

The test result signals TOUT of the circuit block 52, stored in the flipflops 23, 24 and 28, respectively, can be observed at the output terminal 8 with three clock cycles by setting the mode control signals again to the effect that the flipflops 23, 24 and 28 are cascaded-connected by the multiplexers 21, 22 and 27 so as to constitute a shift register, and the test result signals stored in the flipflops 23, 24 and 28 is outputted by a shifting operation of the shift register.

Here, since both of the test results stored in the flipflops 23 and 24 indicate the test result S5 of the circuit block 52, it is sufficient if either of the contents stored in the flipflops 23 and 24 is selected as the test result.

In other words, in order to adjust between the input node number and the output node number of the circuit block 52, the test result S5 of the circuit block 52 is connected in common to the multiplexers 21 and 22 other than the multiplexer 27, so that if the test result signals S5 and S6 are two output signals as in this embodiment, the input signals are similarly made to two signals.

In the normal operation of the above mentioned second embodiment, since either the circuit such as the flipflop operating in synchronism with the clock, or a random logic circuit, does not exist in the signal transfer path between the circuit blocks 51 and 52, and since there exist only the multiplexer 25 for the signal selection between the first output node of the circuit block 51 and the first input node of the circuit block 52, the multiplexer 26 for the signal selection between the second output node of the circuit block 51 and the second input node of the circuit block 52, and the multiplexer 29 for the signal selection between the third output node of the circuit block 51 and the third input node of the circuit block 52, the signal delay is minimized.

In the test mode of the above mentioned second embodiment, when the shift register is constituted by cascade-connecting the flipflops 23, 24 and 28, since only the multiplexer 22 exists between the flipflops 23 and 24, and since only the multiplexer 27 exists between the flipflops 24 and 28, the signal delay can be reduced in comparison with the prior art example.

Figure 3:
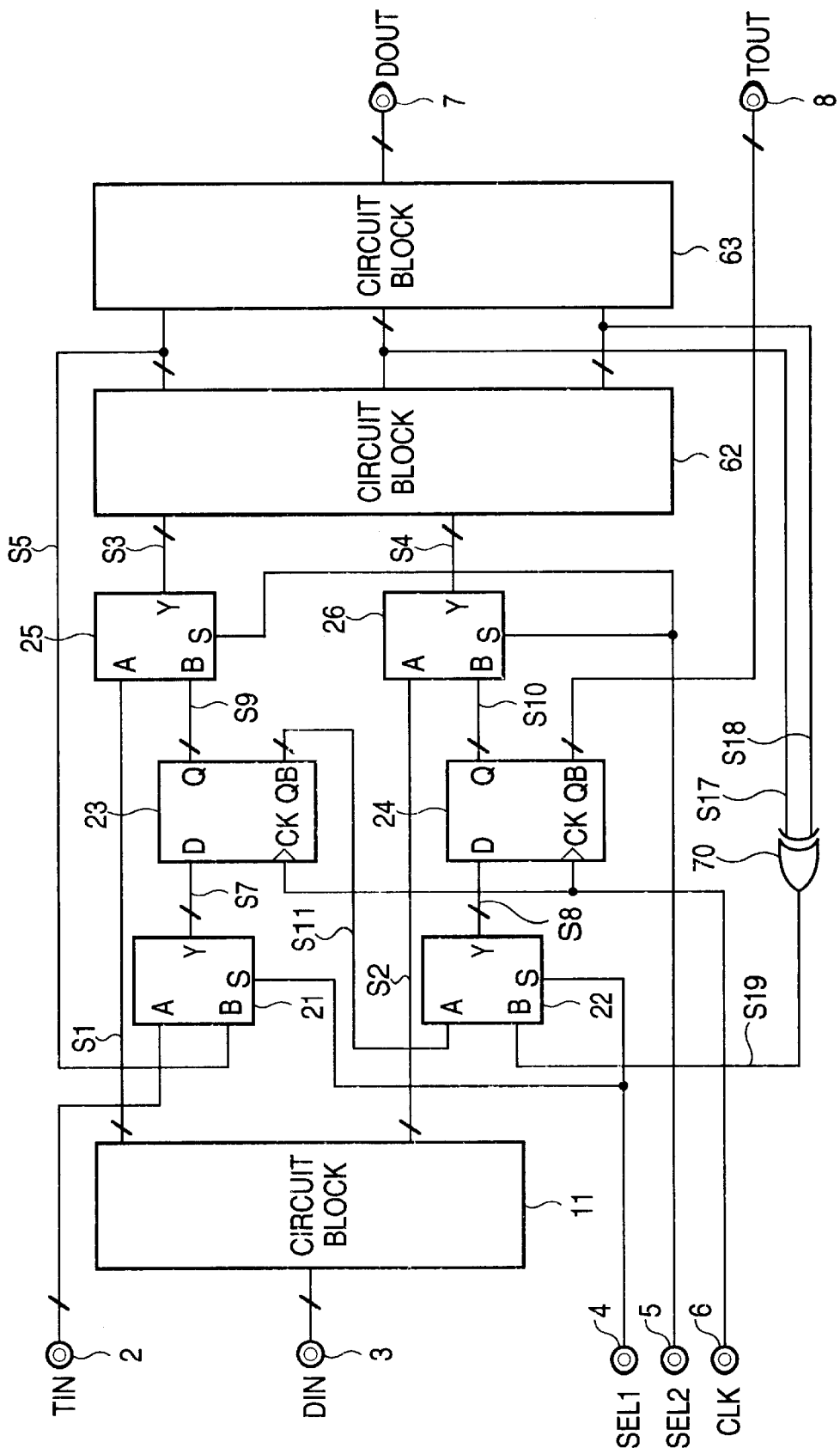
FIG. 3 is a block diagram of a third embodiment of the semiconductor integrated circuit in accordance with the present invention.
Figure 4:
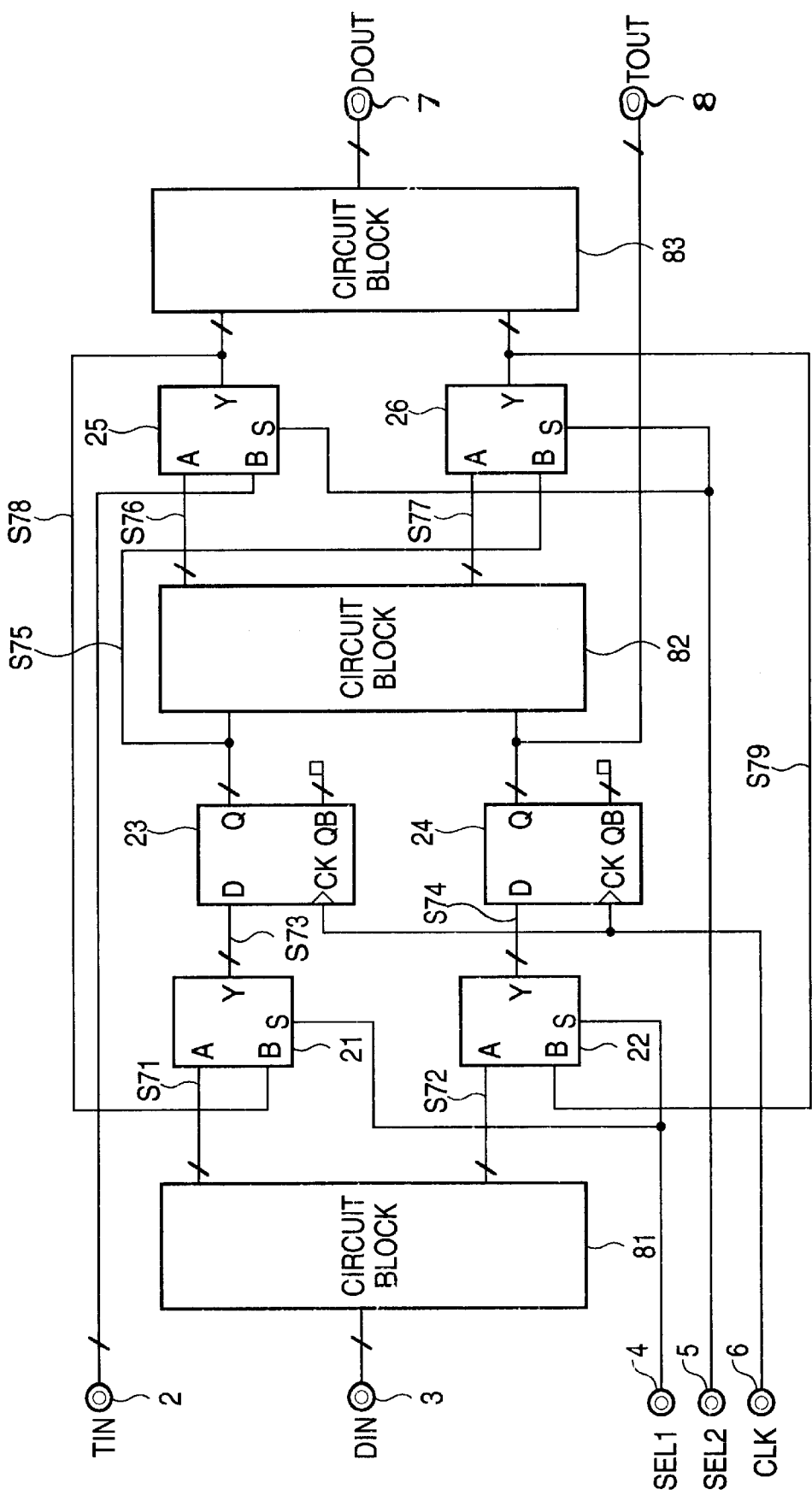
FIG. 4 is a block diagram of one example of the prior art semiconductor integrated circuit.

Next, a third embodiment of the semiconductor integrated circuit in accordance with the present invention will be described with reference to FIG. 3, which is a block diagram of the third embodiment of the semiconductor integrated circuit in accordance with the present invention. In FIG. 3, elements similar to those shown in FIG. 1 are given the same Reference Numerals, and explanation thereof will be omitted for simplification of description.

As seen from comparison between FIG. 1 and FIG. 3, the third embodiment of the semiconductor integrated circuit, generally designated with Reference Numeral 1c, is different from the first embodiment, in that the number of output nodes of a second circuit block 62 is larger than that of the second circuit block 12 by at least one, and correspondingly, the number of input nodes of a third circuit block 63 is larger than that of the third circuit block 13 by at least one, and in that there is added an exclusive-OR circuit 70 for receiving output signals S17 and S18 outputted from the second output node and the added third output node of the circuit block 62, respectively, an output of the exclusive-OR circuit 70 being connected to the input node B of the multiplexer 22. The number of the exclusive-OR circuit 70 is smaller than the number of input nodes of the circuit block 62 by at least one.

Namely, the exclusive-OR circuit 70 is provided to adjust between the output node number and the input node number of the circuit block 62. Therefore, when the output node number of the circuit block 62 is much larger than the input node number of the circuit block 62, a plurality of exclusive-OR circuits are provided each of which receives each two of the output node signals of the circuit block 62, other than the output node signal S5, and furthermore, a exclusive-OR circuit or exclusive-OR circuits are added and connected to constitute a tree structure circuitry so that the number of exclusive-OR circuit at a final stage becomes one.

Since the other points are the same as those of the first embodiment, explanation will be omitted.

Now, an operation will he described. In the normal mode, similarly to the first embodiment, the mode control signal SEL2 is set to select the output signals S1 and S2 of the circuit block 11. On the other hand, the mode control signal SEL1 can be set at an arbitrary value.

The normal input signal DIN supplied through the input terminal 3 is applied to the circuit block 11. The output signal S1 of the circuit block 11 is supplied through only the multiplexer 25 to the circuit block 62. The output signal S2 of the circuit block 11 is supplied through only the multiplexer 26 to the circuit block 62. The output signals S5, S17 and S18 of the circuit block 62 are supplied directly to the circuit block 63 through no logic gate. The normal output signal DOUT of the circuit block 63 is outputted to the output terminal 7.

Next, an operation in the test mode of the circuit block 62 will be described. In the test mode, first, the mode control signals are set to supply the testing input signal TIN to the circuit block 62. Specifically, the mode control signal SEL1 is set to select the testing input signal TIN and the output signal S11 of the flipflop 23, and the mode control signal SEL2 is set to select the output signal S9 of the flipflop 23 and the output signal S10 of the flipflop 24.

In a first clock cycle, the first testing input signal TIN supplied from the input terminal 2 is selected by the multiplexer 21 and the output signal S7 of the multiplexer 21 is stored in the flipflop 23. In a second clock cycle, the first testing input signal stored in the flipflop 23 is selected as the output signal S11 of the flipflop 23 by the multiplexer 22, and stored in the flipflop 24. In the same second clock cycle, the second testing input signal TIN supplied from the input terminal 2 is selected by the multiplexer 21 and stored in the flipflop 23. The two testing input signals TIN stored in the two flipflops 23 and 24 are selected by the multiplexers 25 and 26, respectively, and supplied as the output signals S3 and S4 to the circuit block 62.

After the testing input signals have been inputted to the circuit block 62, the mode control signals are set again in order to observe the test result. For this purpose, the mode control signal SEL1 is set to select the output signal S5 of the circuit block 62 and the output signal S19 of the exclusive-OR circuit 70, respectively. The mode control signal SEL2 is set to select the output signal S9 of the flipflop 23 and the output signal S10 of the flipflop 24.

The output signal S5 indicative of the test result, outputted from the circuit block 62, is selected by the multiplexer 21 during one clock cycle, and stored in the flipflop 23. During the same one clock cycle, the output signals S17 and S18 indicative of the test result, outputted from the circuit block 62, are supplied to the exclusive-OR circuit 70, and a coincidence output S19 outputted from the exclusive-OR circuit 70 is selected by the multiplexer 22 and stored in the flipflop 24.

Thereafter, the mode control signal SEL1 is set to select the testing input signal TIN and the output signal S11 of the flipflop 23, so that the test result TOUT of the circuit block 62 stored in the flipflops 23 and 24 is shifted by a shifting operation of the flipflops 23 and 24 cascade-connected by the multiplexer 22 to constitute the shift register, so that the test result TOUT can be observed at the output terminal 8 with two clock cycles.

In the normal operation of the above mentioned third embodiment, since either the circuit such as the flipflop, operating in synchronism with the clock, or a random logic circuit, does not exist in the signal transfer path between the circuit blocks 11 and 62, and since there exist only the multiplexer 25 for the signal selection between the first output node of the circuit block 11 and the first input node of the circuit block 62, and the multiplexer 26 for the signal selection between the second output node of the circuit block 11 and the second input node of the circuit block 62, the signal delay is minimized.

In the test mode of the above mentioned third embodiment, when the shift register is constituted by cascade-connecting the flipflops 23 and 24, since only the multiplexer 22 exists between the flipflops 23 and 24, the signal delay can be reduced in comparison with the prior art example.

As mentioned above, the semiconductor integrated circuit in accordance with the present invention comprises a first circuit block constituting an input circuit, a second circuit block constituted of a predetermined function block, a third circuit block constituting an output circuit, the first, second and third circuit blocks being cascade-connected, and a testing additional circuit for performing a function test for the second circuit block, the testing additional circuit being provided only at an input side of the second circuit block, and the second circuit block being connected directly to the third circuit block through only interconnections. In a normal operation mode, only one signal selection means for selecting an input signal is provided in a signal transfer path between a first output node of the first circuit block and a first input node of the second circuit block, and only one signal selection means for selecting an input signal is provided in a signal transfer path between a second output node of the first circuit block and a second input node of the second circuit block. In a testing mode using the testing additional circuit, a plurality of flipflops of the number corresponding to the number of the input nodes of the second circuit block, provided for storing a testing signal when a testing signal is applied to the second circuit block and also for storing a test result signal when the test result signal is outputted from the second circuit block, are cascade-connected to constitute a shift register, so that the test result signal is serially outputted by a shifting action of the shift register, with only one signal selection means being interposed between each pair of adjacent flipflops of the shift register.

With the above mentioned arrangement, a first advantage is that, in the normal operation, the signal is supplied from the first circuit block to the second circuit block, independently of the timing of the clock, because only the multiplexer is interposed in the signal transfer path from the first circuit block to the second circuit block.

A second advantage is that, in the normal operation, the signal is transferred from the first circuit block to the second circuit block, with no substantial delay, and therefore, the operation speed can be improved, because the first circuit block is connected to the second circuit block without a logic gate such as a random logic.

A third advantage is that, in the test mode of the second circuit block, the delay of the signal transfer between the first flipflop and the second flipflop which constitute the shift register can be reduced, and therefore, the operation speed can be improved, because only one multiplexer is interposed between the first flipflop and the second flipflop which constitute the shift register.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor integrated circuit comprising a first circuit block constituting an input circuit, a second circuit block constituted of a predetermined function block, a third circuit block constituting an output circuit, said first, second and third circuit blocks being cascade-connected, and a testing additional means for performing a function test for said second circuit block, said testing additional means being provided only at an input side of said second circuit block, and said second circuit block being connected directly to said third circuit block through only interconnections.

2. A semiconductor integrated circuit claimed in claim 1 wherein, in a normal operation mode, only one signal selection means for selecting an input signal is provided in a signal transfer path between a first output node of said first circuit block and a first input node of said second circuit block, and only one signal selection means for selecting an input signal is provided in a signal transfer path between a second output node of said first circuit block and a second input node of said second circuit block, and in a testing mode using said testing additional means, a plurality of flipflops of the number corresponding to the number of the input nodes of said second circuit block, provided for storing a testing signal when a testing signal is applied to said second circuit block and also for storing a test result signal when the test result signal is outputted from said second circuit block, are cascade-connected to constitute a shift register, so that said test result signal is serially outputted by a shifting action of the shift register, with only one signal selection means being interposed between each pair of adjacent flipflops of said shift register.

3. A semiconductor integrated circuit claimed in claim 2 wherein said testing additional means includes a test input terminal for serially receiving said testing signal from an external circuit for said function test of said second circuit block, a test output terminal for serially outputting said test result signal so that the result of said function test of said second circuit block is observed externally, a clock terminal for receiving a clock signal from the external circuit, a first mode control terminal for receiving a first mode control signal from the external circuit, a second mode control terminal for receiving a second mode control signal from the external circuit, said first and second mode control signals being used for changing an operation condition in the test mode, a first multiplexer controlled by said first mode control signal for selectively outputting either a signal from said first output node of said second circuit block or a signal from said test input terminal, a first flipflop for holding the signal selected by said first multiplexer in synchronism with said clock signal, a second multiplexer controlled by said second mode control signal for selectively outputting either a signal from one of outputs of said first flipflop or a signal from said first output node of said first circuit block, a third multiplexer controlled by said first mode control signal for selectively outputting either a signal from the other output of said first flipflop or a signal from said second output node of said second circuit block, a second flipflop for holding the signal selected by said second multiplexer in synchronism with said clock signal, for outputting the selected signal to said test output terminal, and a fourth multiplexer controlled by said second mode control signal for selectively outputting either a signal from one of outputs of said second flipflop or a signal from said second output node of said first circuit block.

4. A semiconductor integrated circuit claimed in claim 3 wherein when said function test of said second circuit block is conducted, said testing additional means cascade-connects said first multiplexer, said first flipflop, said second multiplexer and said second flipflop in the named order to cause them to constitute one shift register, so that a first testing signal inputted from said test input terminal at a first clock and a second testing signal inputted from said test input terminal at a second clock are serially inputted to said shift register and held in said shift register, and said second testing signal held in said first flipflop at said second clock is supplied through said second multiplexer to said first input node of said second circuit block, and said first testing signal held in said second flipflop at said second clock is supplied through said fourth multiplexer to said second input node of said second circuit block, and wherein, of the test result of said function test of said second circuit block, a first partial output is held in said first flipflop through said first multiplexer at a third clock, and simultaneously, a second partial output is held in said second flipflop through said third multiplexer, and thereafter, said first flipflop and said second flipflop are cascade-connected to constitute the shift register, again, under control of said first mode control signal, the test result of said function test is serially outputted from said test output terminal at fourth and fifth clocks.

5. A semiconductor integrated circuit claimed in claim 3 wherein the number of said input nodes of said second circuit block is larger than the number of said output nodes of said second circuit block by at least one, and said first circuit block includes a third output node, and said second circuit block includes a third input node, and wherein said testing additional means further includes a fifth multiplexer controlled by said first mode control signal for selectively outputting either a signal from the other output of said second flipflop or the signal from said second output node of said second circuit block, a third flipflop for holding the signal selected by said fifth multiplexer in synchronism with said clock signal, for outputting the selected signal to said test output terminal, and a sixth multiplexer controlled by said second mode control signal for selectively outputting either a signal from one of outputs of said third flipflop or a signal from said third output node of said first circuit block, said third multiplexer receiving the signal from said first output node of said second circuit block in place of the signal from said second output node of said second circuit block, so that the number of the input nodes of said second circuit block is adapted to the number of the output nodes of said second circuit block.

6. A semiconductor integrated circuit claimed in claim 5 wherein each of the input signal given to said first circuit block and the testing signal given to said testing additional means is a signal of an arbitrary bit number, and each of the output nodes of said first circuit block and the input nodes of said second circuit block is a signal of the same arbitrary bit number obtained by dividing said arbitrary bit number, and each of the output nodes of said second circuit block is a signal of the bit number including the same arbitrary bit number and obtained by dividing said arbitrary bit number.

7. A semiconductor integrated circuit claimed in claim 3 wherein the number of said output nodes of said second circuit block is larger than the number of said input nodes of said second circuit block by at least one, and said second circuit block includes a third output node, wherein said testing additional means further includes an exclusive-OR circuit of the number smaller than the number of said input nodes of said second circuit block by at least one, and said third multiplexer other than said first multiplexer, of the multiplexers located at an input side of said first and second flipflops, receives, in place of the signal from said second output node of said second circuit block, an output signal of said exclusive-OR circuit receiving signals which are outputted from said second and third output nodes of said second circuit block, so that the number of the output nodes of said second circuit block is adapted to the number of the input nodes of said second circuit block.

8. A semiconductor integrated circuit claimed in claim 7 wherein each of the input signal given to said first circuit block and the testing signal given to said testing additional means is a signal of an arbitrary bit number, and each of the output nodes of said first circuit block and the input nodes of said second circuit block is a signal of the same arbitrary bit number obtained by dividing said arbitrary bit number, and each of the output nodes of said second circuit block is a signal of the bit number including the same arbitrary bit number and obtained by dividing said arbitrary bit number.

* * * * *